(12) United States Patent
Chen

(10) Patent No.: US 7,414,860 B1
(45) Date of Patent: Aug. 19, 2008

(54) POWER SUPPLY EARLY WARNING DEVICE FOR PULLING OUT A POWER PLUG

(75) Inventor: Richard Chen, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/790,089

(22) Filed: Apr. 23, 2007

(51) Int. Cl.
*H05K 7/14* (2006.01)
*H05K 7/18* (2006.01)

(52) U.S. Cl. .................. 361/801; 361/802; 361/759

(58) Field of Classification Search ............... 361/759, 361/740, 732, 726, 747, 727, 756, 737, 673
See application file for complete search history.

(56) References Cited

U.S. PATENT DOCUMENTS 5,791,753 A * 8/1998 Paquin .................. 312/332.1
6,439,917 B2 * 8/2002 Tonozuka .................. 439/372
7,104,830 B1 * 9/2006 Diaz ........................ 439/372
7,354,293 B2 * 4/2008 Liang ....................... 439/372

* cited by examiner

*Primary Examiner*—Hung S Bui
(74) *Attorney, Agent, or Firm*—Troxell Law Office, PLLC

(57) ABSTRACT

A power supply early warning device for pulling out a power plug is composed of a power supply, which is loosely connected with a handle, with the handle being installed with a locking hole. A long through-hole is installed at a side edge of the power socket, and a locking member is provided with a pushing plate, with an end of which being formed with a projection piece. the locking member is installed with a locking plate which can be locked or loosely connected into the long through-hole, and the pushing plate can be slidingly displaced on an outer wall of a rim of the long through-hole, allowing the projected piece to be locked into or released from the locking hole of the handle, so as to prevent from a deformation or a short-circuiting between the power plug and the socket by a dragging of external force, and to further enable a user to displace the power supply more safely, without damaging the entire power supply system.

6 Claims, 8 Drawing Sheets

US 7,414,860 B1

POWER SUPPLY EARLY WARNING DEVICE FOR PULLING OUT A POWER PLUG

BACKGROUND OF THE INVENTION a) Field of the Invention

The present invention relates to a power supply early warning device for pulling out a power plug, and more particularly to a power supply wherein before rotating and displacing a handle thereof, a power plug should be pulled out by an operation and movement of a locking member that the handle of the power supply can be rotated and displaced, as well as that the power supply can be drawn out.

b) Description of the Prior Art

A computer cabinet, such as an industrial computer cabinet or a server, is plugged with a plurality of power supplies, and sockets of all the power supplies are plugged with power plugs. When an operator is performing a maintenance work, he or she usually forgets to pull the power plug out of the socket of the power supply, resulting in that when the operator pulls and displaces the power supply out of the server or cabinet, the power supply is still connected with the power plug, thereby causing a deformation or a short-circuiting between the power plug and the socket of the power supply from a dragging by external force.

Accordingly, how to enable that before drawing and displacing the power supply, the power plug of the power supply should be pulled out of the power supply that the handle of the power supply can be rotated, and that the power supply can be drawn and displaced, is a technical issue to be pursued by the present inventor.

SUMMARY OF THE INVENTION

The primary object of present invention is to provide a power supply early warning device for pulling out a power plug, wherein a locking member is installed between a U-shape handle and a socket of the power supply, such that before the power plug is pulled out of the socket, the U-shape handle cannot be rotated by force, thereby achieving that when the power supply is extracted and displaced, the power plug has been certainly pulled out of the power socket by a user, so as to prevent from a deformation or a short-circuiting between the power plug and the socket due to a dragging of external force, and to further provide a safer operation upon displacing the power supply, without causing a damage to the entire power supply system.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
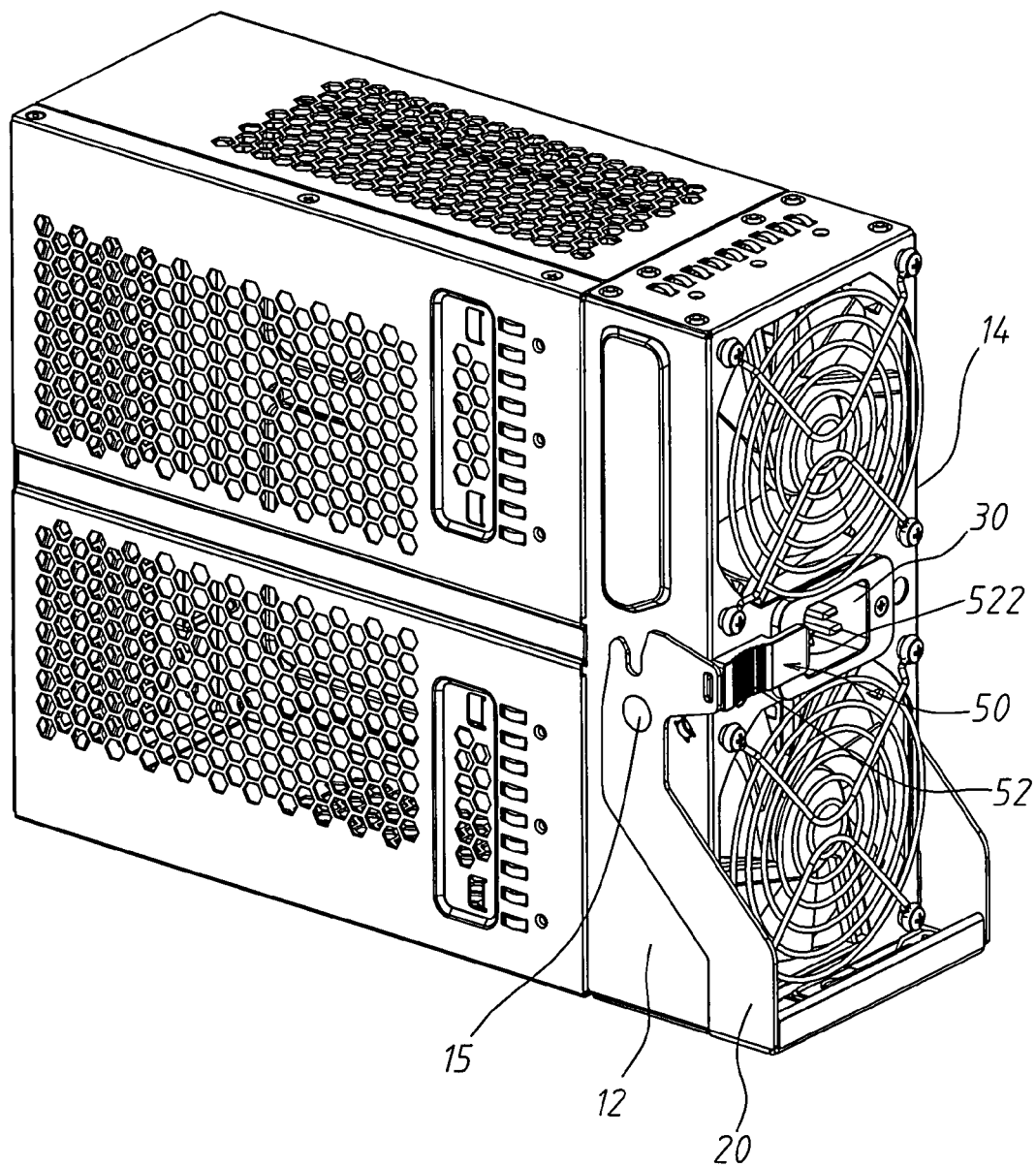
FIG. 1 shows a perspective view of the present invention after being assembled.
Figure 2:
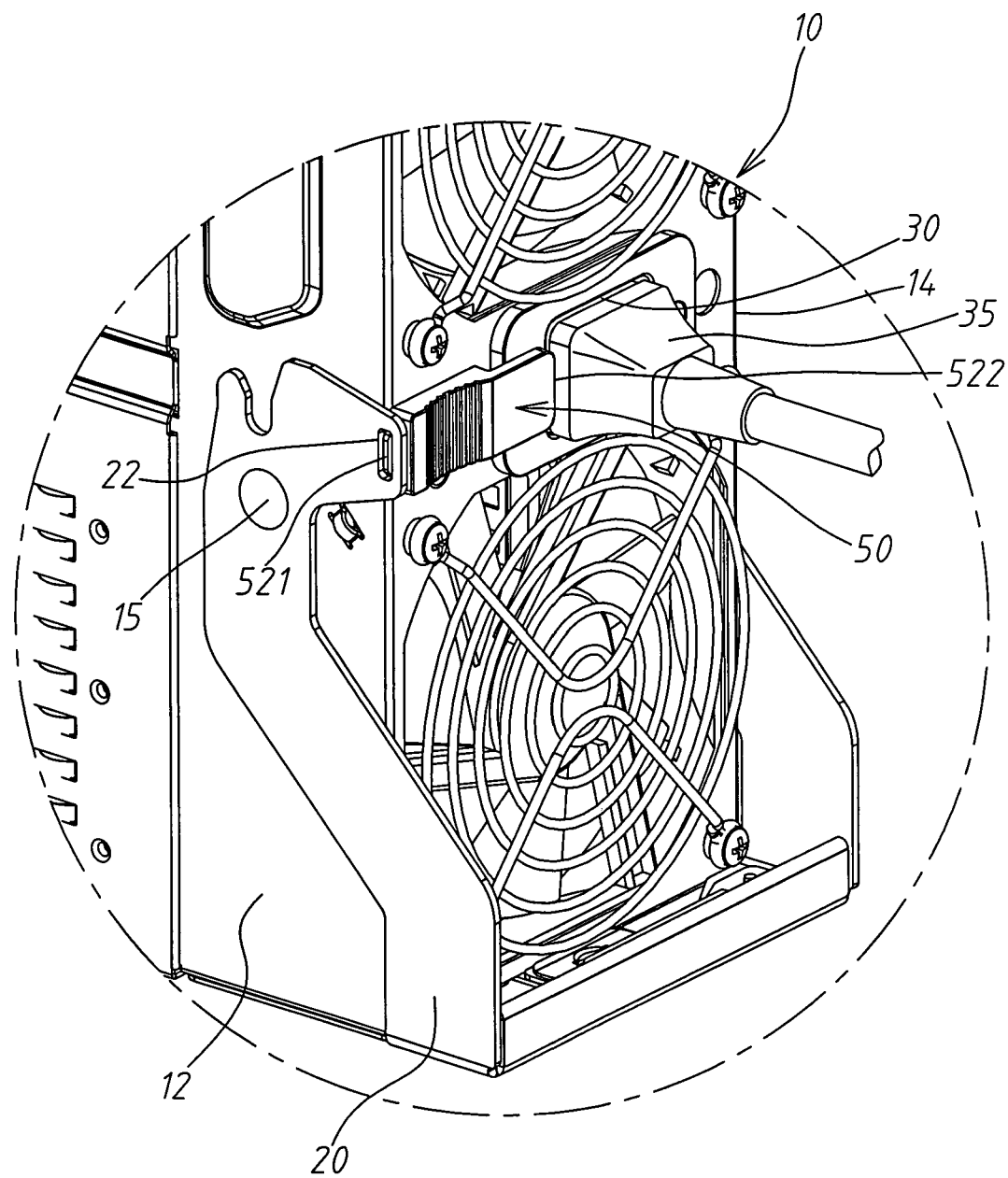
FIG. 2 shows a local exploded view of a locking member, a power plug, and a handle, which are assembled on a power supply, according to the present invention.
Figure 3:
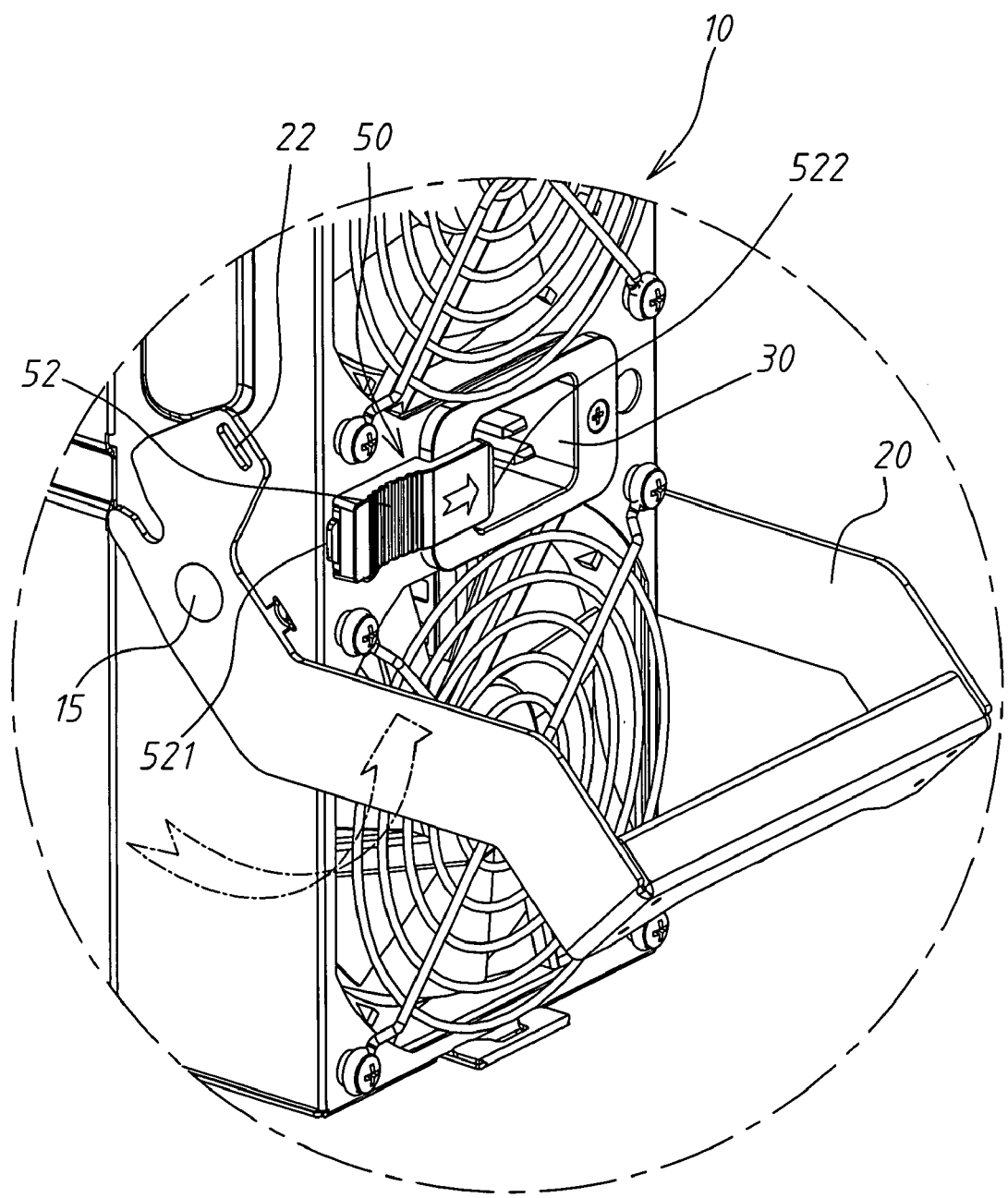
FIG. 3 shows a local exploded view of a handle and a locking member, which are separated, according to the present invention.
Figure 4:
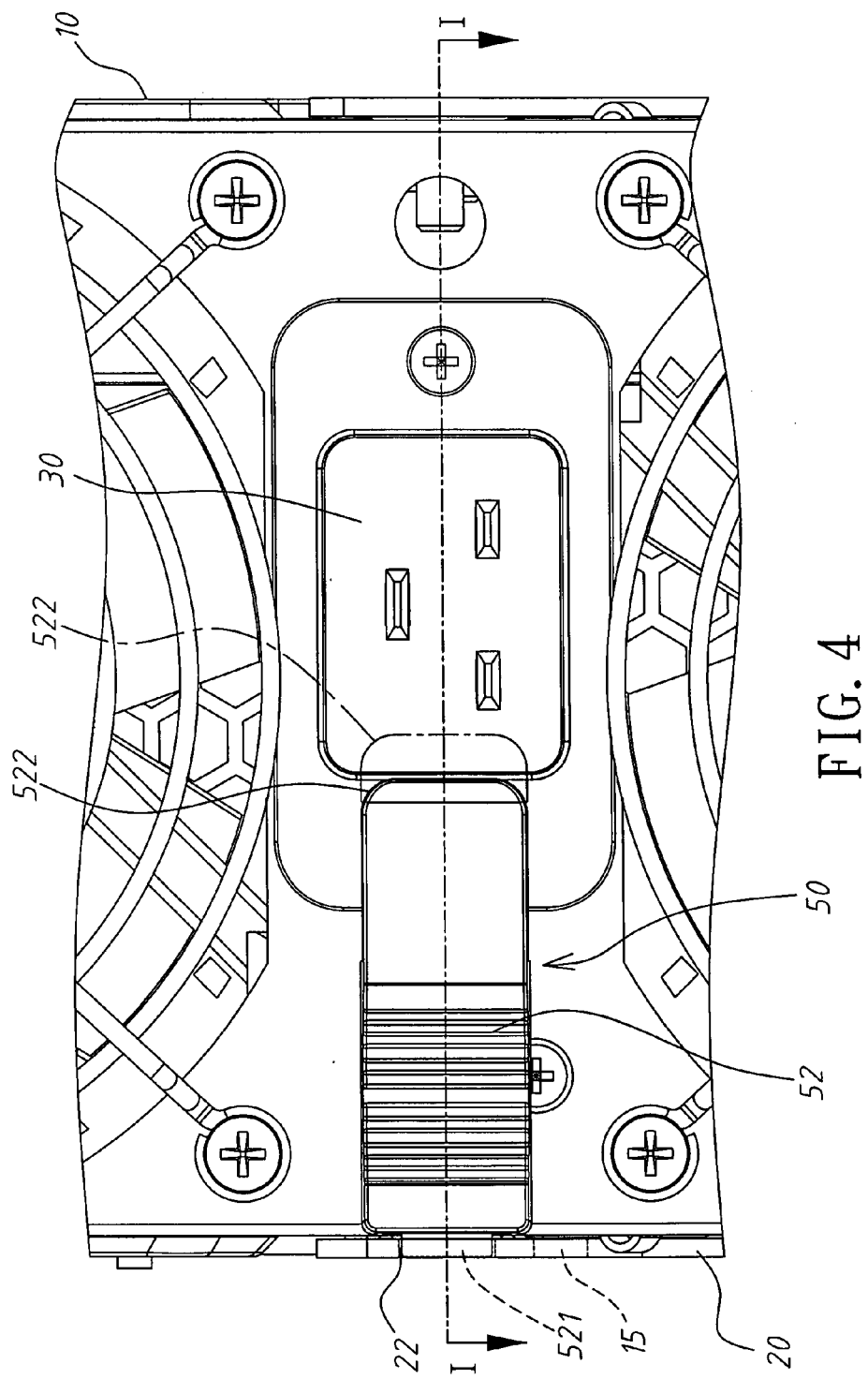
FIG. 4 shows a local plan view of an operation that a locking member is displaced on a power supply, according to the present invention.
Figure 7:
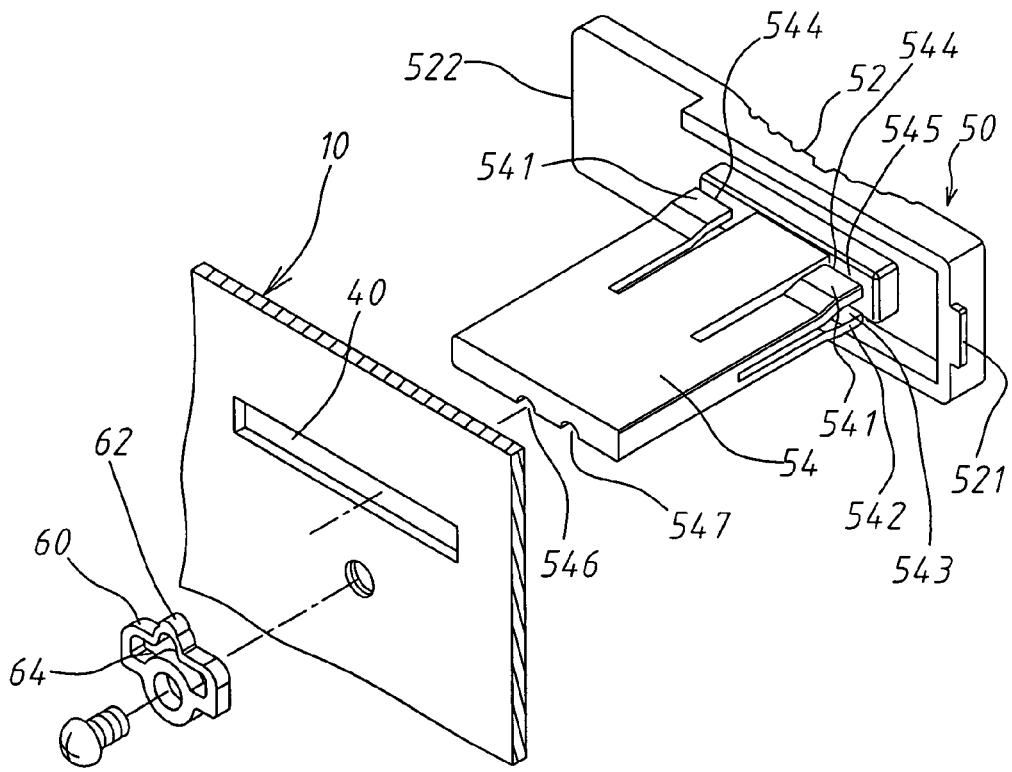
FIG. 7 shows an exploded view of a locking member which is inserted into a long through-hole of a power supply, according to the present invention.

Referring to FIGS. 1 to 5, the present invention is to provide a power supply early warning device for pulling out a power plug, wherein left and right surfaces 12, 14 of a power supply 10 are provided with shaft pins 15 which are loosely connected with a U-shape handle 20, with a locking hole 22 being located at an end part of the handle 20; a power socket 30 is installed on a wall of the power supply 10; a long through-hole 40 is installed at a side edge of the power socket 30; and a locking member 50 (as shown in FIG. 7) is provided with a transversal pushing plate 52, with an end of which being installed with a projection piece 521, and with an inner side of the locking member 50 being provided with a vertically extended locking plate 54 which can be locked and loosely connected into the long through-hole 40. By being subjected to pushing force, the pushing plate 52 can be slidingly displaced on an outer wall of a rim of the long through-hole 40, allowing the projection piece 521 to be locked into or released from the locking hole 22 of the handle 20 (as shown in FIG. 3 and FIG. 4), and controlling a space, which is extended into the power socket 30, to be covered by the other end edge 522 of the pushing plate 52.

Figure 8:
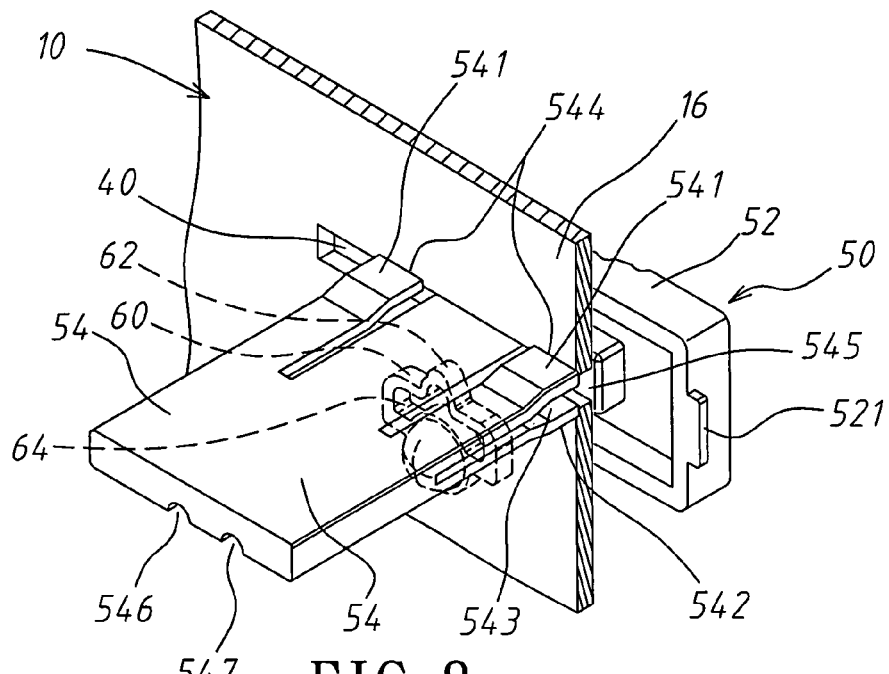
FIG. 8 shows a perspective view of a locking member which is inserted into a long through-hole of a power supply, according to the present invention.

Referring to FIG. 7 and FIG. 8, at least one edge of the locking plate 54 is provided with an upper clipping piece 541 and a lower clipping piece 542 which are elastic. A space 543 is formed between the upper and lower clipping pieces 541, 542, and the upper and lower clipping pieces 541, 542 are integrally formed with the locking plate 54. Entire height of the upper and lower clipping pieces 541, 542 is larger than width of the long through-hole 40. A longitudinal gap 545 is formed between end parts 544 of the upper, lower clipping pieces 541, 542 and an inner wall of the locking plate 54, and is connected with the long through-hole 40 (as shown in FIG. 8). The end parts 544 of the upper and lower clipping pieces 541, 542 are abutted on an inner wall 16 of a rim of the long through-hole 40.

Referring to FIG. 7 and FIG. 8, a lower surface of the locking plate 54 is provided a first groove 546 and a second groove 547 which are next to each other. A flexible elastic member 60, a top end of which is formed with a projected part 62, is screwed on a rear wall of the power supply 10, and the projected part 62 is located below the long through-hole 40, such that when the locking plate 54 displaces transversally to left or right, the projected part 62 can be positioned into the first groove 546 or the second groove 547.

Figure 5:
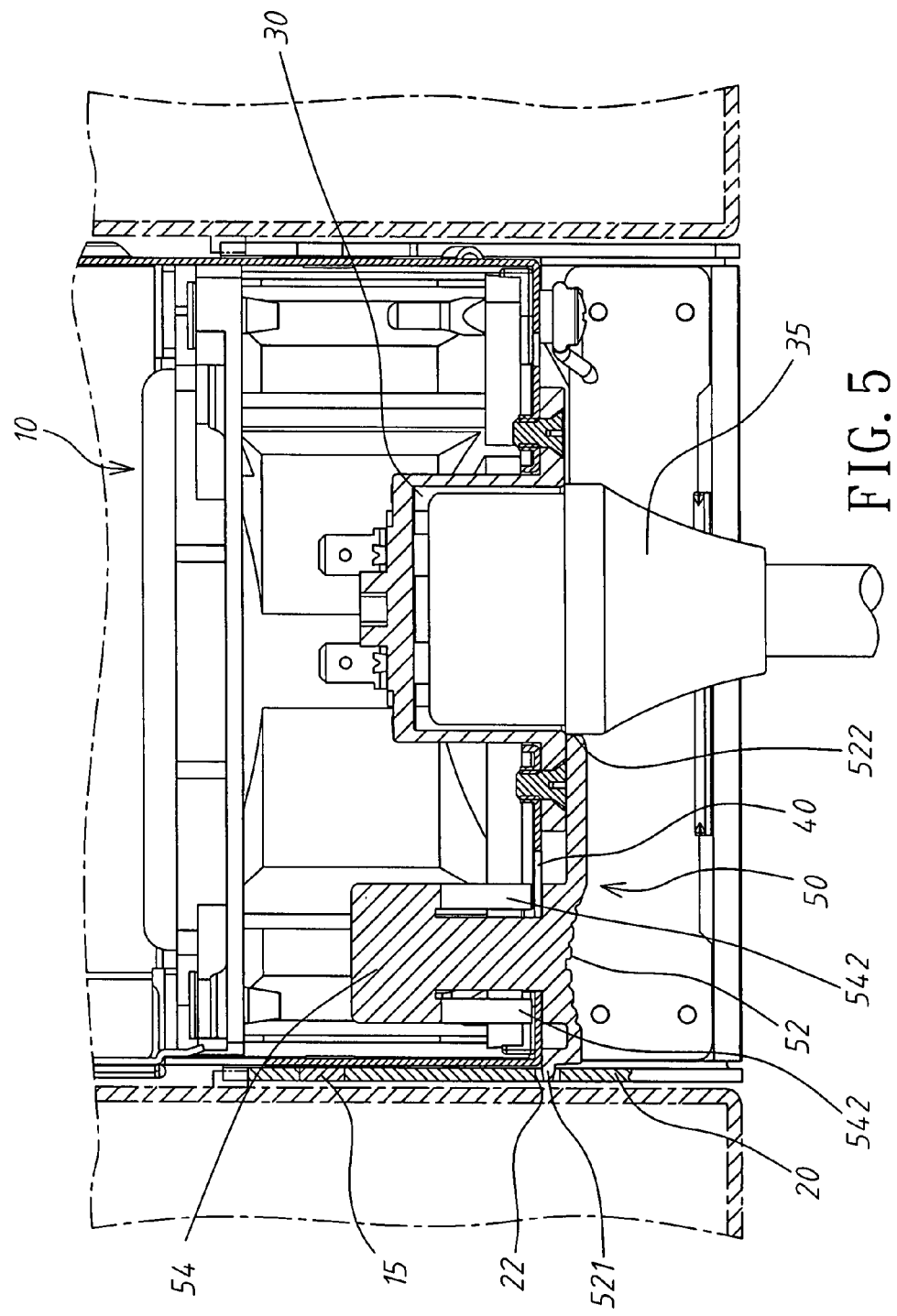
FIG. 5 shows a cross sectional view along a line 1-1 of FIG. 4.

Referring to FIG. 5, the power socket 30 provides for a plugging of a power plug 35, and the end edge 522 of the pushing plate 52 is abutted on a side surface of the power plug 35.

Referring to FIG. 4, if the power socket 30 is not plugged with the power plug 35, and when the pushing plate 52 is subjected to the pushing force, the end edge 522 of the pushing plate 52 will be slidingly displaced in a space of the power socket 30, and the projection piece 521 will be sliding out of the locking hole 22, enabling the handle 20 to be rotated.

Referring to FIG. 7 and FIG. 8, the elastic member 60 is a plastic product, is provided with a hollow part 64, and the projected part 62 can be elastically deformed upon being squeezed.

Figure 6:
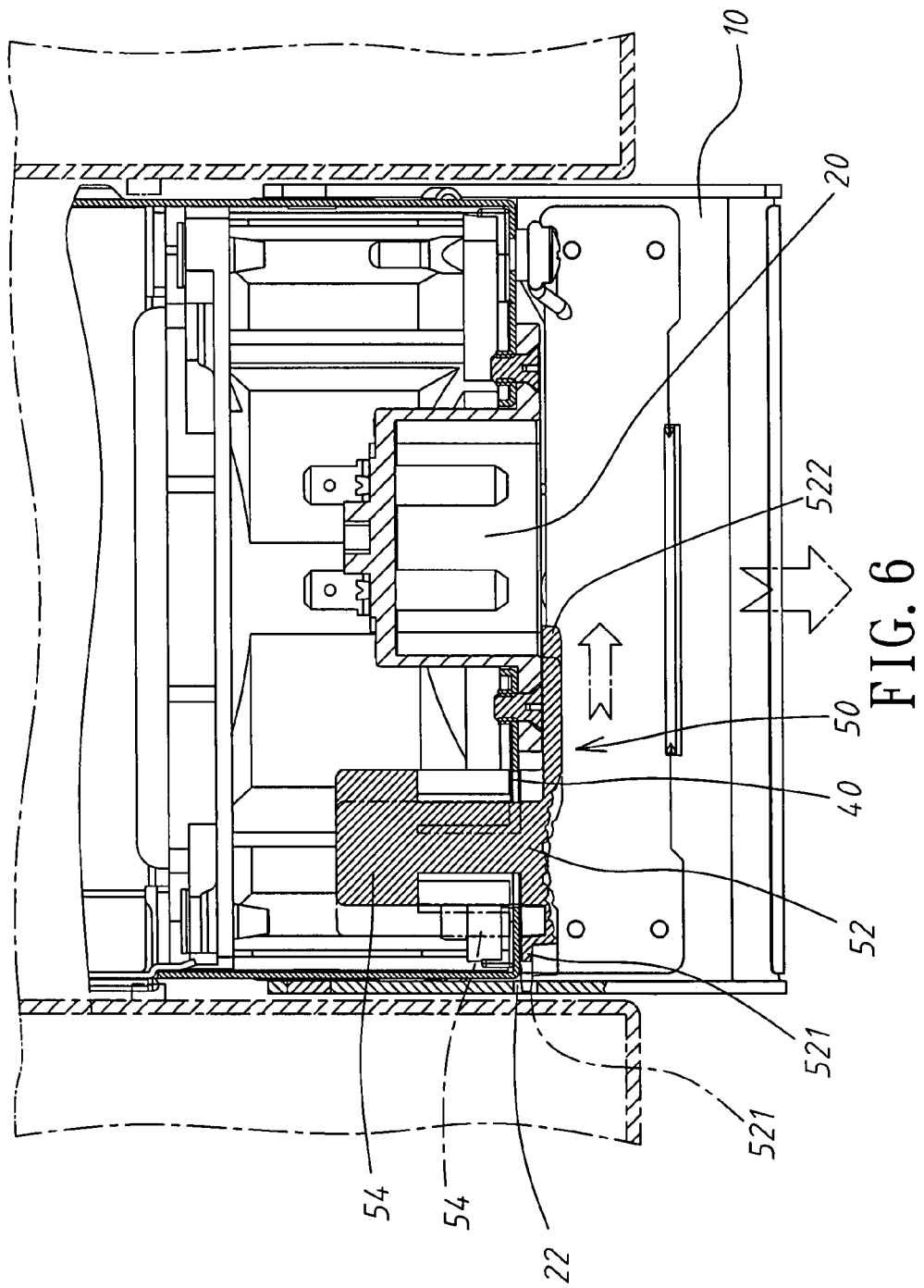
FIG. 6 shows a cross sectional view of an operation that a power plug is pulled out and a handle is displaced in FIG. 4.

Referring to FIG. 4 and FIG. 6, before the power plug 35 is pulled out of the power socket 30, as the locking hole 22 of the handle 20 is positioned by being locked in with the projection piece 521, the handle 20 will not be rotated by a user. Therefore, the user has to use fingers to exert force to push the pushing plate 52, which enables the pushing plate 52 to be displaced a distance, allowing the projection piece 521 to escape from the locking hole 22. Before carrying out this operation, the user applies an extremely common logic concept; that is, he or she will naturally think about pulling the power plug 35 out of the power socket 30 to expose the internal space of the power socket 30. Then, as shown in FIG. 3 and FIG. 4, the pushing plate 52 can be pushed by the user's fingers, and the pushing plate 52 will be displaced transversally a distance towards the power socket 30, enabling the end edge 522 of the pushing plate 52 to move into the space of the power socket 30, and allowing the projection piece 521 to escape from the locking hole 22. Accordingly, the entire handle 20 can be rotated by the force exerted by the user's fingers, with the shaft pins 15 as a center of rotation axis, thereby enabling the entire power supply 10 to be displaced out horizontally.

Figure 9:
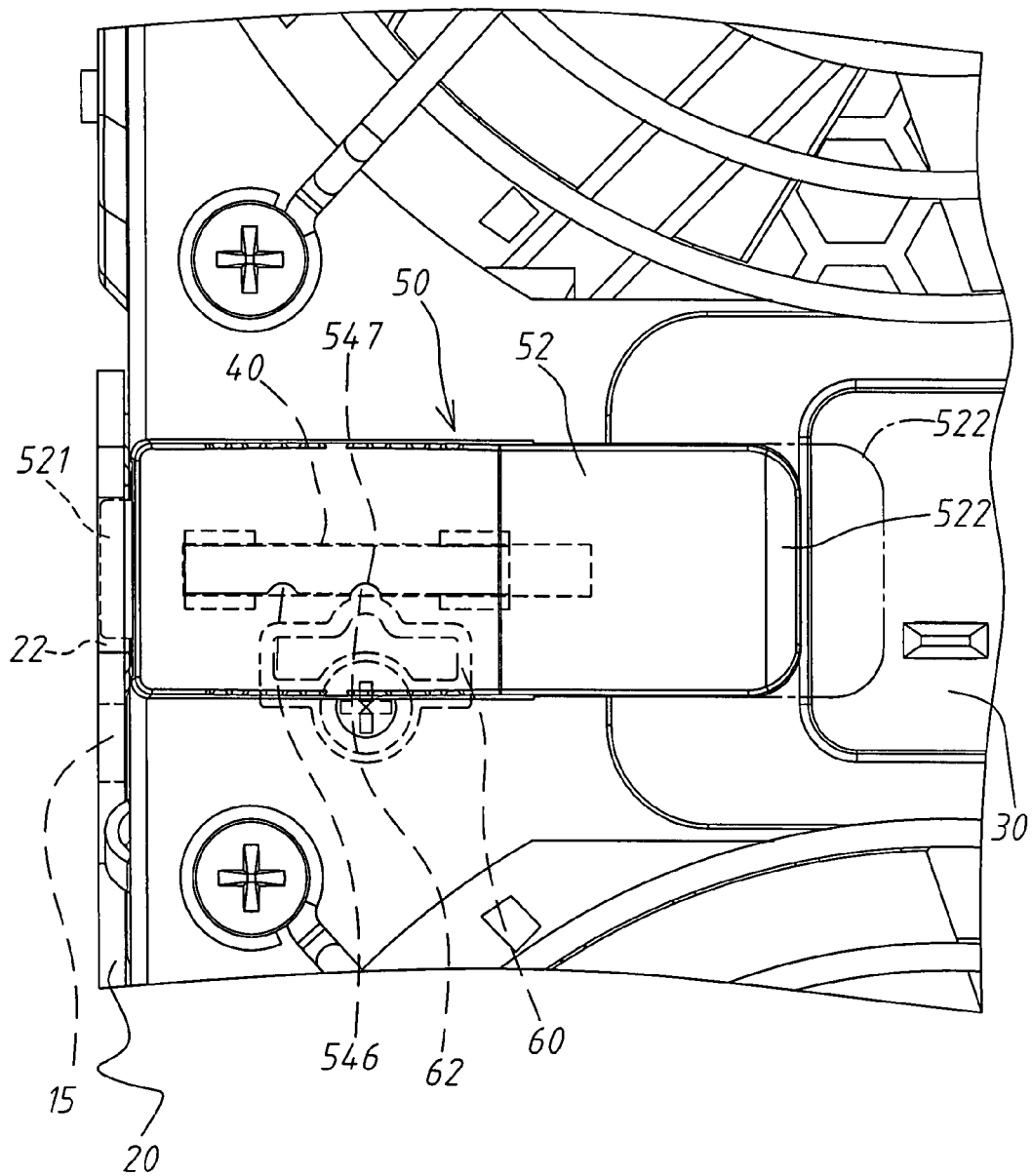
FIG. 9 shows a plan view of an operation that a locking member is displaced on a wall of a power supply, according to the present invention.

Referring to FIGS. 7 to 9, when the locking member 50 moves transversally, as the entire height of the upper and lower clipping pieces 541, 542 is larger than the width (or height) of the long through-hole 40, the locking member 50 can be only displaced transversally in the long through-hole 40, and cannot move forward or backward. When the locking member 50 displaces horizontally, two positioning points are available, meaning that when the projected part 62 of the elastic member 60 is locked into the first groove 546, the projection piece 521 is locked into the locking hole 22, and the handle 20 will not be rotated; on the other hand, when the projected part 62 is locked into the second groove 547, the projection piece 521 is released from the locking hole 22, and the handle 20 can be rotated by the force. As the projected part 62 is flexible and elastic, when the bottom surface of the locking plate 54 is in contact with the projected part 62 by the force, the projected part 62 will be deformed by squeezing; whereas when the projected part 62 corresponds to groove spaces of the first and second grooves 546, 547, it will be restored elastically again, thereby achieving a positioning function after the locking plate 54 is transversally displaced.

When the locking member 50 is to be extracted out of the inner wall 16, the upper and lower clipping pieces 541, 542 are pressed by human fingers, such that when the entire height of the upper and lower clipping pieces 541, 542 is reduced to smaller than the width (or height) of the long through-hole 40, the locking plate 54 can be successfully extracted out of the power supply 10.

Accordingly, by installing the locking member 50, which can slide transversally, on the rear wall of the power supply 10, when the user draws the power supply 10 to be displaced, he or she will absolutely need to pull the power plug 35 out of the power socket 30 that the handle 20 can be operated, such that when the power supply 10 is pulled out, a safe operation can be provided and the power supply 10 can be prevented from being damaged.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A power supply early warning device for pulling out a power plug, comprising:
a power supply, left and right surfaces of which are provided with shaft pins to be loosely connected with a U-shape handle, with an end part of the handle being installed with a locking hole; a power socket being installed on a wall of the power supply; a long through-hole being installed at a side edge of the power socket; and a locking member being provided with a transversal pushing plate, with an end of the pushing plate being installed with a projection piece, and with an inner side of the locking member being installed with a vertically extended locking plate which is locked and loosely connected into the long through-hole; when the pushing plate being subjected to pushing force, the pushing plate being slidingly displaced on an outer wall of a rim of the long through-hole, allowing the projection piece to be locked into or released from the locking hole of the handle, and controlling a space, which is extended into the power socket, to be covered by the other end edge of the pushing plate.

2. The power supply early warning device for pulling out a power plug, according to claim 1, wherein at least one side edge of the locking plate is provided with an upper clipping piece and a lower clipping piece which are elastic, a space is formed between the upper and lower clipping pieces, the upper and lower clipping pieces are integrally formed with the locking plate, entire height of the upper and lower clipping pieces is larger than width of the long through-hole, and a longitudinal gap is provided between end parts of the upper, lower clipping pieces and an inner wall of the locking plate, with the longitudinal gap being connected with the long through-hole, and with the end parts of the upper and lower clipping pieces being abutted on an inner wall of a rim of the long through-hole.

3. The power supply early warning device for pulling out a power plug, according to claim 1, wherein a lower surface of the locking plate is provided with a first groove and a second groove which are next to each other; an flexible elastic member, a top end of which is formed with a projected part, being screwed on a rear wall of the power supply, with the projected part being located below the long through-hole, such that when the locking plate displaces transversally to left or right, the projected part is positioned into the first groove or the second groove.

4. The power supply early warning device for pulling out a power plug, according to claim 1, wherein the power socket provides for a plugging of a power plug, and an end edge of the pushing plate is abutted on a side surface of the power plug.

5. The power supply early warning device for pulling out a power plug, according to claim 1, wherein if the power socket is not plugged with the power plug, and when the pushing plate is subjected to pushing force, an end edge of the pushing plate is slidingly displaced in a space of the power socket, and the projection piece is sliding out of the locking hole, enabling the handle to be rotated.

6. The power supply early warning device for pulling out a power plug, according to claim 1, wherein the elastic member is a plastic product, is provided with a hollow part, and the projected part is elastically deformed upon being squeezed.

* * * * *